United States Patent [19]
Kumagai

[11] Patent Number: 5,304,802
[45] Date of Patent: Apr. 19, 1994

[54] SEMICONDUCTOR DEVICE INCLUDING OVERVOLTAGE PROTECTIVE CIRCUIT

[75] Inventor: Naoki Kumagai, Kawasaki, Japan

[73] Assignee: Fuji Electric Co., Ltd., Kawasaki, Japan

[21] Appl. No.: 697

[22] Filed: Jan. 5, 1993

[30] Foreign Application Priority Data

Jan. 6, 1992 [JP] Japan .................................. 4-000357

[51] Int. Cl.[5] ...................... H01L 29/10; H01L 29/78; H01L 29/06
[52] U.S. Cl. .................................. 257/328; 257/133; 257/146; 257/154; 257/173; 257/336; 257/337; 257/359; 257/362; 257/363; 257/603
[58] Field of Search ............... 257/133, 146, 154, 163, 257/164, 165, 169, 173, 174, 175, 328, 336, 337, 344, 355, 358, 359, 360, 361, 362, 363, 364, 379, 380, 408, 603, 605

[56] References Cited

U.S. PATENT DOCUMENTS

| | | | |
|---|---|---|---|
| 4,705,322 | 11/1987 | Yiannoulos | 361/91 |
| 4,980,741 | 12/1990 | Temple | 357/38 |
| 5,045,902 | 9/1991 | Bancal | 257/328 |
| 5,079,608 | 1/1992 | Wodarczyk et al. | 257/603 |
| 5,138,415 | 8/1992 | Yano | 257/603 |
| 5,162,966 | 11/1992 | Fujihira | 257/328 |

FOREIGN PATENT DOCUMENTS

| | | |
|---|---|---|
| 0467799 | 1/1992 | European Pat. Off. |
| 1170705 | 11/1969 | United Kingdom |
| 2127214 | 4/1984 | United Kingdom |

Primary Examiner—Ngan Ngo
Attorney, Agent, or Firm—Spencer, Frank & Schneider

[57] ABSTRACT

A semiconductor device including a switching device such as a MOSFET or an IGBT, and an avalanche device for protecting the switching device by generating an avalanche current when an overvoltage is applied to the switching device. The avalanche device shares a drift layer, that is, an epitaxial layer with the switching device. With this arrangement, the avalanche voltage of the avalanche device follows changes in the withstanding voltages of the switching device due to variations in the thickness or impurity concentration of the epitaxial layer or temperature. This makes it possible to reduce the margin between the avalanche voltage of the avalanche device and the withstanding voltage of the switching device, and to positively protect the switching device from damage.

8 Claims, 4 Drawing Sheets

SEMICONDUCTOR DEVICE INCLUDING OVERVOLTAGE PROTECTIVE CIRCUIT

BACKGROUND OF THE INVENTION

1. Field of the Invention

The present invention relates to a power switching device used for controlling a motor or the like, and more particularly to a semiconductor device including a switching device and an overvoltage protective circuit.

2. Description of the Prior Art

FIG. 1 is a circuit diagram showing a semiconductor device including a conventional overvoltage protective circuit. The semiconductor device employs an n-channel MOSFET 1 as a switching device connected between load terminals 5 and 6. An overvoltage protective circuit 40 is provided for protecting the MOSFET 1 from an overvoltage. The overvoltage protective circuit 40 comprises an avalanche diode 2 that generates an avalanche current when an overvoltage is applied, and a current limiting resistor-diode 3 for restricting the avalanche current. The diode and resistor are connected in series between the drain electrode D and the gate electrode G of the MOSFET 1. In addition, a reference (Zener) diode 4 for protecting the gate electrode G from the overvoltage is connected between the gate electrode G and the source electrode S. Furthermore, the gate voltage is applied from a control input terminal 9 to the gate electrode G through a gate resistor 8. Thus, the MOSFET 1 is controlled to enter the OFF state, that is, the voltage blocking state by applying a low gate voltage.

Unless the overvoltage protective circuit 40 for protecting the MOSFET 1 from an overvoltage is provided an overvoltage that exceeds the withstanding voltage of the MOSFET 1 applied thereto will cause the avalanche current to flow through the MOSFET 1, resulting in damage of the MOSFET 1 when the avalanche current is excessively large. Generally, the avalanche current intensely flows through locations where the electric field is concentrated such as locations where the curvature of the PN junction is small, which PN junction is formed to establish the withstanding voltage. Accordingly, the current density is liable to increase in such locations. This may often cause damage of the MOSFET 1 even if the avalanche current is rather small per se.

On the other hand, the overvoltage protective circuit 40 as shown in FIG. 1 can protect the MOSFET 1 from such damage by setting the avalanche voltage of the avalanche diode 2 below the withstanding voltage of the MOSFET 1. More specifically, by setting the withstanding voltage of the avalanche diode 2 below that of the MOSFET 1, the avalanche current flows first through the avalanche diode 2 rather than the MOSFET 1 when overvoltage occurs across the load terminals 5 and 6. Since the avalanche current flows through the gate resistor 8 to the control input terminal 9, a voltage drop takes place across the gate resistor 8. Thus, the gate voltage increases and the MOSFET 1 conducts. As a result, the energy of the overvoltage across the load terminals 5 and 6 is absorbed in the form of the ON current of the MOSFET 1. This reduces the voltage across the load terminals 5 and 6, which in turn drops the avalanche current flowing through the avalanche diode 2. Thus, the MOSFET 1 tries to change into the OFF state again. In practice, however, the avalanche current of the avalanche diode 2 balances the current flowing through the MOSFET 1 so that a constant current flows through the MOSFET 1, which current is determined by factors such as the impedance of the voltage source supplying the overcurrent. Thus, the overvoltage protective circuit 40 protects the MOSFET 1 from the overvoltage by preventing the avalanche current from flowing through the MOSFET 1. Further, as long as the impedance of the voltage source is not too small, the avalanche current flowing through the avalanche diode 2 does not increase to a degree that damages the diode 2, thereby protecting the semiconductor device in its entirety.

Thus, the semiconductor device comprising such an overvoltage protective circuit can protect the switching device from damage by setting the avalanche voltage of the avalanche diode 2 below the withstanding voltage of the switching device. However, considering variations in the avalanche voltage of the avalanche diode, the withstanding voltage of the switching device must be set sufficiently higher than the avalanche voltage. The high withstanding voltage of the switching device, however, increases the ON state voltage and the switching loss of the switching device because the high withstanding voltage requires a thick drift layer through which the depletion layer spreads.

Furthermore, with regard to bipolar devices such as an IGBT (Insulated Gate Bipolar Transistor), when an inductive load such as a motor is turned off, an overvoltage takes place across the emitter and collector because of the -di/dt due to the inductive component such as stray reactance. As a result, although the gate voltage begins to drop and the current begins to reduce in this case, the base voltage of the NPN transistor constituting the IGBT increases. This causes a constant drain current to continue to flow. Thus, the minority carrier moves through the depletion layer spreading through the PN junction, and the electric charges of the minority carrier strengthen the electric field in the depletion layer. Accordingly, it is necessary to consider the reduction in the withstanding voltage from the static withstanding voltage in the IGBT or the like in the case of a turnoff operation. This will require a further increase in the margin between the withstanding voltage of the switching device and the avalanche voltage. As a result, the device characteristics such as an ON state voltage of the bipolar devices like an IGBT tend to be further degraded.

SUMMARY OF THE INVENTION

It is therefore an object of the present invention to provide a semiconductor device including an overvoltage protective circuit, which can protect the device from damage while maintaining a good switching characteristics.

According to the present invention, there is provided a semiconductor device including an overvoltage protective circuit, the semiconductor device comprising:

a semiconductor switching device including a drift layer with relatively high specific resistance through which a depletion layer spreads while the semiconductor switching device is in the voltage blocking state, the drift layer being provided for establishing a withstanding voltage of the semiconductor switching device;

an avalanche device generating an avalanche current when a load voltage applied to the semiconductor switching device exceeds a predetermined voltage, the avalanche device sharing the drift layer with the semiconductor switching device; and driving means for driving a gate of the semiconductor switching device in response to the avalanche current.

Here, the avalanche device may comprise a PN junction formed in the drift layer, the curvature of the PN junction being smaller than that of a PN junction of the semiconductor switching device formed in the drift layer.

The semiconductor switching device may be a MOSFET comprising:

a well of a first conductivity type formed in the top surface of the drift layer of a second conductivity type, the well forming the PN junction of the semiconductor switching device at the interface with the drift layer;

a source layer of the second conductivity type formed in the top surface of the well;

a drain layer of the second conductivity type formed on the bottom surface of the drift layer;

a gate electrode formed on the source layer, the well and the drift layer via an oxide film;

a source electrode connected to the source layer; and a drain electrode connected to the drain layer.

The PN junction of the avalanche device may be formed at the interface between the drift layer and an avalanche layer formed in the drift layer, and the driving means may comprise a resistor formed on the top surface of the drift layer via an oxide film, the resistor being connected between the avalanche layer and the gate electrode.

The driving means may further comprise a Zener diode formed on the top surface of the drift layer via an oxide film, the Zener diode being connected between the gate electrode and the source electrode.

The semiconductor switching device may be an IGBT comprising:

a well of a first conductivity type formed in the top surface of the drift layer of a second conductivity type, the well forming the PN junction of the semiconductor switching device at the interface with the drift layer;

an emitter layer of the second conductivity type formed in the top surface of the well;

a base layer of the second conductivity type formed on the bottom surface of the drift layer;

a collector layer of the first conductivity type formed on the bottom surface of the base layer;

a gate electrode formed on the emitter layer, the well and the drift layer via an oxide film;

an emitter electrode connected to the emitter layer; and a collector electrode connected to the collector layer.

The PN junction of the avalanche device may be formed at the interface between the drift layer and an avalanche layer formed in the drift layer, and the driving means may comprise a resistor formed on the top surface of the drift layer via an oxide film, the resistor being connected between the avalanche layer and the gate electrode.

The driving means may further comprise a Zener diode formed on the top surface of the drift layer via an oxide film, the Zener diode being connected between the gate electrode and the emitter electrode.

The driving means may comprise:

current detecting means for detecting the avalanche current; and means for controlling a voltage applied to the gate of the semiconductor switching device in response to a detected result of the current detecting means.

According to the present invention, it is possible to change the avalanche voltage in accordance with the change in the withstanding voltage of the switching device of the semiconductor device because the avalanche device shares, with the switching device, the drift layer provided for determining the withstanding voltage characteristics of the switching device. In other words, the avalanche voltage can follow the change in the withstanding voltage characteristics, and hence, the avalanche current surely begins to flow through the avalanche device before it flows through the switching device. As a result, a narrow margin between the semiconductor switching device and the avalanche voltage is enough to protect the switching device from damage. More specifically, even if the withstanding voltage characteristics may change because of the variations in the thickness and concentration of the drift layer for the withstanding voltage, or in minority carriers introduced into the depletion layer during the turn-off operation, the avalanche voltage is kept smaller than the withstanding voltage of the switching device because the avalanche voltage of the avalanche device formed in the drift layer fluctuates in the same manner as the withstanding voltage of the switching device. As a result, margin between the switching device and the avalanche device can be reduced so that a semiconductor device having a low ON state voltage and a low switching loss can be obtained.

The avalanche voltage of the avalanche device can be set below the withstanding voltage of the semiconductor switching device by making the curvature of the PN junction of the avalanche device smaller than that of the semiconductor switching device. The curvature is one of the factors for determining the withstanding voltage of the switching device.

In addition, the current detecting means provided for detecting the avalanche current makes it possible to further ensure overvoltage protection by controlling the gate voltage of the semiconductor switching device in accordance with the initial amount of avalanche current.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 1:
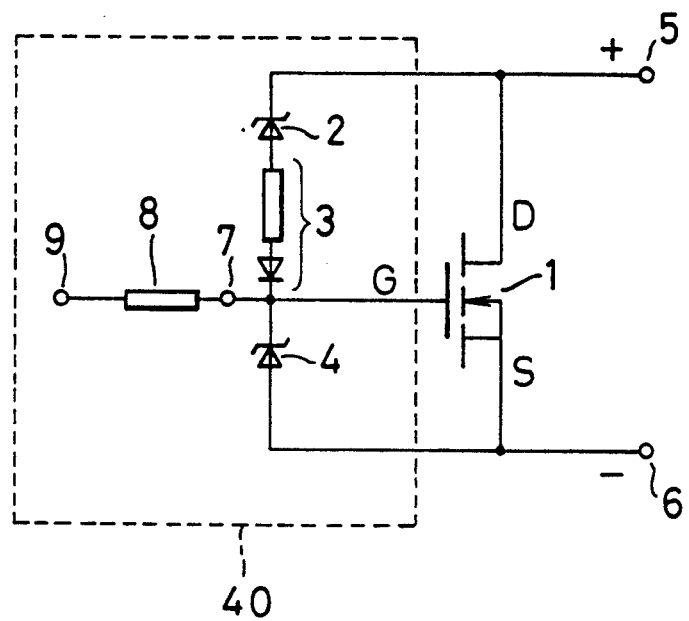
FIG. 1 is a circuit diagram illustrating the equivalent circuit of a semiconductor device incorporating an avalanche diode for protecting the device from an overvoltage.
Figure 2:
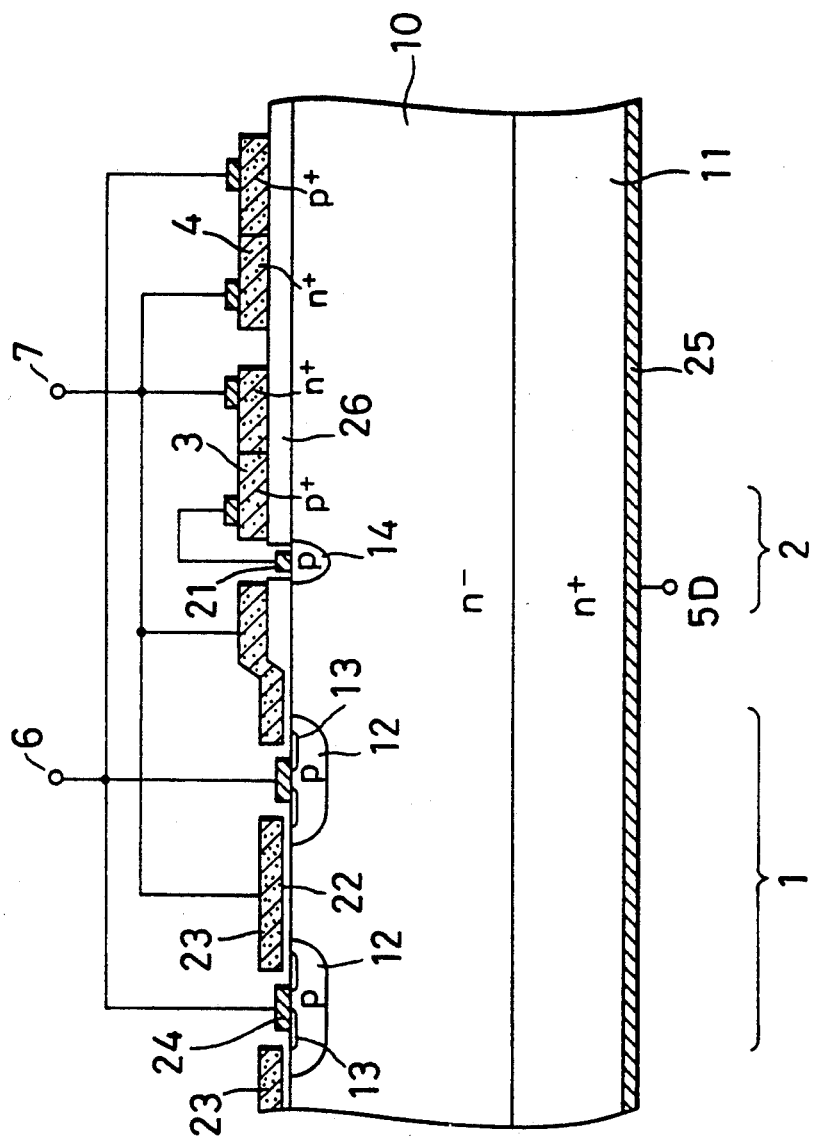
FIG. 2 is a cross-sectional view showing the structure of a first embodiment of a semiconductor device according to the present invention.

FIG. 2 shows a cross-section of a first embodiment of a semiconductor device in accordance with the present invention. The semiconductor device of the embodiment employs a MOSFET 1 as its switching device, and has an equivalent circuit as shown in FIG. 1 as stated before. The semiconductor device comprises an n-type epitaxial layer 10, an n+-type drain layer 11 formed on the bottom of the layer 10, a drain electrode 25 formed on the drain layer 11, a plurality of p-type wells 12 embedded in the top surface of the n−-type epitaxial layer 10. The epitaxial layer 10 is a drift layer through which a depletion layer spreads while the MOSFET 1 is in the voltage blocking state (OFF state), and is provided for establishing a withstanding voltage of the MOSFET 1. Further, n+-type source layers 13 are formed in each p-type well 12, and a source electrode 24 is disposed on the source layers 13 in each p-type well 12. A gate electrode 23 is disposed on a gate oxide film 22 in such a manner that it ranges from the source layer 13 to the top surface of the epitaxial layer 10 via the well 12. Thus, the MOSFET 1 comprises the source layers 13, the wells 12, the epitaxial layer 10 and the drain layer 11.

An avalanche diode, on the other hand, is formed immediately next to the MOSFET 1. It comprises an avalanche layer 14 of a p-type drift layer formed near one of the wells 12. The avalanche layer 14 is narrower than the well, and has a curvature smaller than that of the well. An electrode 21 is connected to the avalanche layer 14. The avalanche layer 14 is a drift layer formed by diffusing ions implanted from an opening narrower than the well so that the curvature of the avalanche layer 14 becomes smaller than that of the wells 12. Thus, the avalanche diode 2 of the semiconductor device comprises the electrode 21, the avalanche layer 14, the epitaxial layer 10, the drain layer 11 and the drain electrode 25. Since the curvature of the avalanche layer 14 is smaller than that of the wells 12, the electric field is liable to concentrate on the avalanche layer 14 rather than on the wells 12, thereby inducing the avalanche current earlier than the current that might flow through the MOSFET 1 when an overvoltage occurs.

The current limiting resistor-diode 3 including considerable resistance and a reference diode 4 for protecting the gate, which are made of polysilicon or the like, are formed on an initial oxide film 26 which is formed on the top surface of the epitaxial layer 10. The electrode 21 is connected to the gate terminal 7 through the current limiting resistor-diode 3, and the gate terminal 7 is connected to the source terminal 6 through the reference diode 4. Thus, the overvoltage protecting circuit 40 as shown in FIG. 1 is constructed.

With such an arrangement, if an overvoltage is applied across the source terminal 6 and the drain terminal 5 by accident, the avalanche current takes place in the avalanche diode 2 including the epitaxial layer 10. Since the avalanche current flows through the current limiting resistor-diode 3 and the gate resistor 8, the gate voltage increases. Accordingly, MOSFET 1 conducts and a current flows from the drain to the source, and therefore, the overvoltage applied across the source and drain is eliminated. This protects the MOSFET 1 from damage.

According to the semiconductor device of the first embodiment, the avalanche diode 2 which responds to the overvoltage shares the epitaxial layer 10 with the MOSFET 1. Consequently, the avalanche voltage of the avalanche diode 2 changes in accordance with the withstanding voltage of the MOSFET 1 which may fluctuate owing to the variations in the thickness, impurity concentration or the like of the epitaxial layer 10. Thus, it is unnecessary to consider the variations due to the difference of individual MOSFETS, once the avalanche diode has been designed so that the avalanche voltage is set lower than the withstanding voltage of the MOSFET 1 by controlling the factors that have an influence upon the avalanche voltage such as the curvature of the avalanche layer 14 as in the present embodiment. As a result, it is not required to establish a large margin between the withstanding voltage of the MOSFET and the avalanche voltage at the cost of the characteristics of the device such as the ON state voltage. Thus, the present embodiment can provide a semiconductor device that can accomplish protection against an overvoltage with maintaining a good switching characteristic.

Although the avalanche voltage is controlled by making the curvature of the avalanche layer small in this embodiment, it can also be controlled by other factors such as controlling the depth of the avalanche layer.

EMBODIMENT 2

Figure 3:
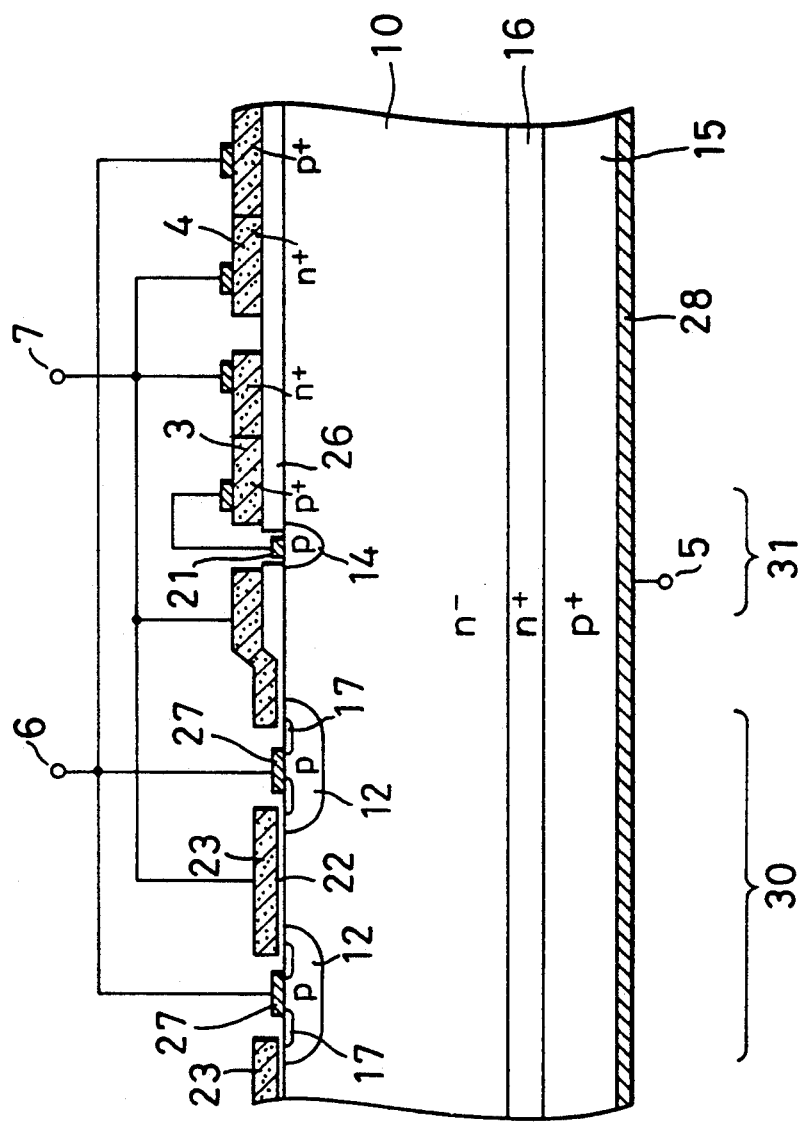
FIG. 3 is a cross-sectional view showing the structure of a second embodiment of a semiconductor device according to the present invention.

FIG. 3 shows the structure of a second embodiment of the semiconductor device in accordance with the present invention. The semiconductor device employs an IGET as a switching device. The semiconductor device comprises the n−-type epitaxial layer 10, an n+-type base layer 16 formed on the bottom surface of the epitaxial layer 10, a p+-type collector layer 15 formed on the base layer 16, a collector electrode 28 disposed on the collector layer 15, a buffer layer 12 consisting of a plurality of p-type wells embedded in the top surface of the n+-type epitaxial layer 10. Further, n+-type emitter layers 17 are formed in each p-type well, and an emitter electrode 27 is disposed on the emitter layers 17 in each p-type well. In addition, as in the first embodiment, the gate electrode 23 is disposed on the gate oxide film 22 in such a manner that it ranges from the surface of the emitter layer 17 to the surface of the epitaxial layer 10 via the base layer 12. Thus, these elements are integrated into the IGBT 30 wherein electrons are injected into the epitaxial layer 10 to induce the conductivity modulation.

As in the first embodiment, a PNP transistor 31 functioning as an avalanche device is formed immediately next to the IGBT 30. It comprises the avalanche layer 14 of a p-type drift layer formed near one of the p-type wells 12. The avalanche layer 14 is narrower than the p-type well, and has a curvature smaller than that of the p-type well. The electrode 21 is connected to the avalanche layer 14. Thus, the open-base PNP transistor 31 of the semiconductor device comprises the electrode 21, the avalanche layer 14, the epitaxial layer 10, the base layer 16, the collector layer 15 and the collector electrode 28. The avalanche current flows through the PNP transistor 31 as in the first embodiment.

As in the first embodiment, the current limiting resistor-diode 3 and the reference diode 4 for protecting the gate are formed on the initial oxide film 26 which is formed on the top surface of the epitaxial layer 10. The reference diode 4 for protecting the gate is connected between the collector terminal 6 and the gate terminal 7. The PNP transistor 31 for generating the avalanche current to protect the IGBT 30 from an overvoltage is connected in series with the current limiting resistor-diode 3 between the emitter terminal 5 and the gate terminal 7.

Here, the typical thickness of each layer is as follows: the epitaxial layer 10, 50 μm; the buffer layer 12, 5 μm; the avalanche layer 14, 5 μm; the collector layer 15, 400 μm; the base layer 16, 10 μm; and the emitter layer 17, 0.5 μm. The preferred surface diameter of each p-type well 12 is 16 μm, and that of the avalanche layer 14 is 6 μm. Typical impurity concentration of the p-type well 12 at the surface is $1 \times 10^{17}$ atoms/cm$^3$ and that of the emitter layer 17 is $1 \times 10^{17}$ atoms/cm$^3$. Furthermore, typical resistivities (specific resistances) of layers 10, 15 and 16 are 40 Ωcm, 0.01 Ωcm and 0.02 Ωcm, respectively. In this case, the withstanding voltage of the IGBT 30 is about 600V, and that of the PNP transistor 31 is about 570V.

Figure 4:
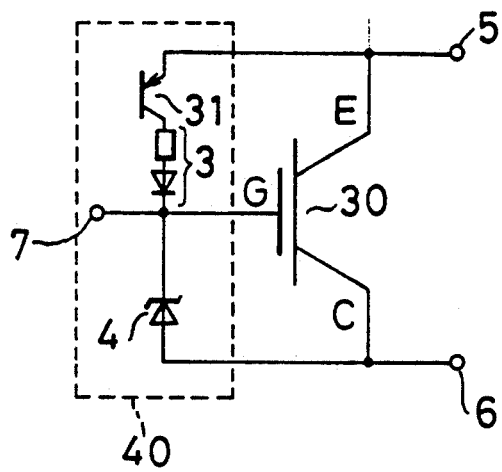
FIG. 4 is a circuit diagram showing the equivalent circuit of the second embodiment shown in FIG. 3.

The equivalent circuit of the device of FIG. 3 is shown in FIG. 4. As seen from this figure, the device of this embodiment is similar to that of the first embodiment except that it employs the IGBT 30 instead of the MOSFET 1, and the PNP transistor 31 instead of the avalanche diode 2. Accordingly, an overvoltage applied to the IGBT 30 causes an avalanche current flowing through the PNP transistor 31. This raises the gate voltage, and conducts the IGBT 30, thereby eliminating the overvoltage state. As a result, no voltage exceeding the withstanding voltage of the IGBT 30 is applied thereto, and hence, the IGBT 30 is protected from damage.

Generally speaking, in a bipolar device such as an IGBT 30, an overvoltage due to the current change di/dt is 41 plied across the emitter and the collector when the inductive load is turned off. Hence, holes, which are the minority carrier and present in the depletion layer, spread from the wells 12 across the PN junction with the epitaxial layer 10, and these electric charges increase the electric field. In this case, a greater electric field concentrates on the PN junction than in the static state. This may sometimes deteriorate the characteristics of the withstanding voltage. In this embodiment, however, since the PNP transistor 31 for generating the avalanche current is formed near the well 12 by using the epitaxial layer 10 which is also used to form the IGBT 30, an electric field similar in magnitude to that of the IGBT 30 is present. Accordingly, the avalanche current is sure to take place in the PNP transistor 31 before the overvoltage reaches the withstanding voltage of the IGBT, thus inducing no inversion of the withstanding voltage of the IGBT 30 and the avalanche voltage of the transistor 31. This makes it possible to protect IGBT 30 from the damage.

Thus, the avalanche voltage of the PNP transistor 31 at which the avalanche current begins to flow changes in accordance with the changes in the withstanding voltage of the IGBT 30. Therefore, unlike the conventional devices, it is not necessary to set a large margin between the withstanding voltage of the IGBT 30 and the avalanche voltage in designing the IGBT 30. As a result, it is unnecessary to form a thick epitaxial layer so as to establish a large margin, and this reduces both the ON state voltage and the switching loss of the device.

Although the first and second embodiments are described exemplifying the vertical device wherein the source layer and the drain layer, or the emitter layer and the collector layer are formed on the top and bottom surfaces of the epitaxial layer, the present invention can also be applied to a lateral device wherein these layers are formed in one surface of the epitaxial layer so as to improve the characteristics of the device and to protect the device from damage.

EMBODIMENT 3

Figure 5:
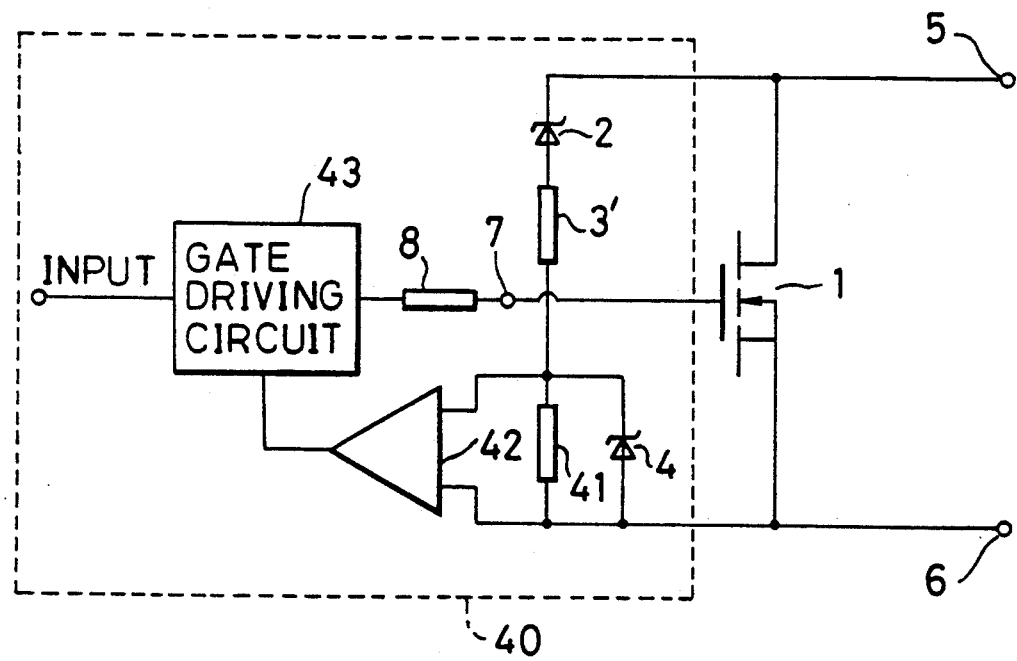
FIG. 5 is a circuit diagram showing the equivalent circuit of a third embodiment of a semiconductor device according to the present invention.

FIG. 5 is the circuit diagram of a semiconductor device of a third embodiment. The device employs the MOSFET 1 as a switching device as in the first embodiment. The avalanche diode 2 protecting the MOSFET 1 from the withstanding voltage damage is constructed by using the epitaxial layer 10 constituting the MOSFET 1 as in the first embodiment. Consequently, the avalanche voltage of the avalanche diode 2 changes in accordance with the change in the withstanding voltage of the MOSFET 1, thus preventing the withstanding voltage damage of the MOSFET 1 beforehand.

It should be noticed here that the avalanche current from the avalanche diode 2 is not used to directly drive the gate of the MOSFET 1 in this embodiment. More specifically, a detecting resistor 41 is serially connected with the avalanche diode 2 and a current limiting resistor 3, between the drain terminal 5 and the source terminal 6, and the voltage drop across the detecting resistor 41 is detected by a voltage detecting circuit 42. When the voltage detecting circuit 42 detects the voltage drop across the detecting resistor 41, the gate voltage is applied to the gate terminal 7 of the MOSFET 1 from a gate driving circuit 43 via the gate resistor 8 so that the MOSFET 1 enters the conduction state. Thus, even a weak avalanche current can quickly charge the gate electrode of the MOSFET 1 owing to the gate driving circuit 43. As a result, a sudden increase the load voltage applied between the drain terminal 5 and the source terminal 6 can change the MOSFET 1 into the conduction state rapidly. This ensures more positive protection from damage for the MOSFET 1.

The overvoltage protective circuit comprising the voltage detecting circuit 42 and the gate driving circuit 43 may be built on the epitaxial layer via the initial oxide film as in the first and second embodiments. Alternatively, it may be formed as a separate circuit. A similar overvoltage protective circuit can also be applied to the IGBT to protect it more positively.

Although the avalanche voltage is controlled by shrinking the curvature of the p-type or p+ type avalanche layer of the avalanche device in the above described embodiments, it can also be controlled by other factors such as the depth of the avalanche layer. Furthermore, the difference in planar geometry, such as stripes or cells, of the p-type well 12 and the avalanche layer 14 can also provide the difference in the avalanche voltage.

Further, although the MOSFET or IGBT is employed as the switching device of the embodiments, the present invention can also be applied to a self-extinguishing type device such as an MCT (MOS-Controlled Thyristor) or a bipolar transistor so that the switching device is positively protected from damage by the avalanche device. This makes it possible to improve the characteristics of the device itself.

Although specific embodiments of a semiconductor device including an overvoltage protective circuit constructed in accordance with the present invention have been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

The present invention has been described in detail with respect to preferred embodiments, and it will now be apparent from the foregoing to those skilled in the art that changes and modifications may be made without departing from the invention in its broader aspects, and it is the intent, therefore, in the appended claims to cover all such changes and modifications as fall within the true spirit of the invention.

What is claimed is:

1. A semiconductor device including an overvoltage protective circuit, the semiconductor device comprising:
    a semiconductor switching device including a drift layer with relatively high specific resistance, through which a depletion layer spreads while said semiconductor switching device is in a non-conducting voltage blocking state, said drift layer being provided for establishing a withstanding voltage of said semiconductor switching device;
    an avalanche device generating an avalanche current when a load voltage applied to said semiconductor switching device exceeds a predetermined voltage, said avalanche device comprising a PN junction formed in said drift layer, a curvature of said PN junction being smaller than that of a PN junction of said semiconductor switching device formed in said drift layer, said avalanche device sharing said drift layer with said semiconductor switching device; and
    driving means for driving a gate of said semiconductor switching device in response to said avalanche current.

2. A semiconductor device including an overvoltage protective circuit as claimed in claim 1, wherein said semiconductor switching device is a MOSFET comprising:
    a well of a first conductivity type formed in a top surface of said drift layer of a second conductivity type, said well forming said PN junction of said semiconductor switching device at an interface with said drift layer;
    a source layer of the second conductivity type formed in a top surface of said well;
    a drain layer of the second conductivity type formed on a bottom surface of said drift layer;
    a gate electrode formed over said source layer, said well and said drift layer via an oxide film;
    a source electrode connected to said source layer; and
    a drain electrode connected to said drain layer.

3. A semiconductor device including an overvoltage protective circuit as claimed in claim 2, wherein said PN junction of said avalanche device is formed at the interface between said drift layer and an avalanche layer formed in said drift layer, and said driving means comprises a resistor formed over the top surface of said drift layer via an oxide film, said resistor being connected between said avalanche layer and said gate electrode.

4. A semiconductor device including an overvoltage protective circuit as claimed in claim 3, wherein said driving means further comprises a Zener diode formed over the top surface of said drift layer via an oxide film, said Zener diode being connected between said gate electrode and said source electrode.

5. A semiconductor device including an overvoltage protective circuit as claimed in claim 1, wherein said semiconductor switching device is an IGBT comprising:
    a well of a first conductivity type formed in a top surface of said drift layer of a second conductivity type, said well forming said PN junction of said semiconductor switching device at an interface with said drift layer;
    an emitter layer of the second conductivity type formed in a top surface of said well;
    a base layer of the second conductivity type formed on a bottom surface of said drift layer;
    a collector layer of the first conductivity type formed on a bottom surface of said base layer;
    a gate electrode formed over said emitter layer, said well and said drift layer via an oxide film;
    an emitter electrode connected to said emitter layer; and
    a collector electrode connected to said collector layer.

6. A semiconductor device including an overvoltage protective circuit as claimed in claim 5, wherein said PN junction of said avalanche device is formed at an interface between said drift layer and an avalanche layer formed in said drift layer, and said driving means comprises a resistor formed over the top surface of said drift layer via an oxide film, said resistor being connected between said avalanche layer and said gate electrode.

7. A semiconductor device including an overvoltage protective circuit as claimed in claim 6, wherein said driving means further comprising a Zener diode formed over the top surface of said drift layer via an oxide film, said Zener diode being connected between said gate electrode and said source electrode.

8. A semiconductor device including an overvoltage protective circuit as claimed in claim 1, wherein said driving means comprises:
    current detecting means for detecting said avalanche current; and
    means for controlling a voltage applied to the gate of said semiconductor switching device in response to a detected result of said current detecting means.

* * * * *